United States Patent
Klawuhn et al.

(10) Patent No.: US 7,510,634 B1
(45) Date of Patent: Mar. 31, 2009

(54) APPARATUS AND METHODS FOR DEPOSITION AND/OR ETCH SELECTIVITY

(75) Inventors: Erich R. Klawuhn, Los Altos, CA (US); Robert Rozbicki, San Francisco, CA (US); Girish A. Dixit, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 23 days.

(21) Appl. No.: 11/558,693

(22) Filed: Nov. 10, 2006

(51) Int. Cl.
*C23C 14/35* (2006.01)

(52) U.S. Cl. .............................. 204/298.03; 204/298.16; 204/298.17; 204/298.18; 204/298.23; 204/298.29; 204/192.17

(58) Field of Classification Search ............ 204/298.03, 204/298.16, 298.17, 298.18, 298.23, 298.29, 204/192.17
See application file for complete search history.

(56) References Cited

U.S. PATENT DOCUMENTS

| | | | |
|---|---|---|---|
| 4,058,430 A | 11/1977 | Suntola et al. | |
| 4,492,620 A | 1/1985 | Matsuo et al. | |
| 4,588,490 A | 5/1986 | Cuomo et al. | |
| 4,609,903 A | 9/1986 | Toyokura et al. | |
| 4,622,121 A * | 11/1986 | Wegmann et al. | 204/298.18 |
| 4,737,384 A | 4/1988 | Murthy et al. | |
| 5,009,963 A | 4/1991 | Ohmi et al. | |
| 5,084,412 A | 1/1992 | Nakasaki | |
| 5,139,825 A | 8/1992 | Gordon et al. | |
| 5,178,739 A | 1/1993 | Barnes et al. | |
| 5,194,398 A | 3/1993 | Miyachi et al. | |
| 5,221,449 A | 6/1993 | Colgan et al. | |
| 5,281,485 A | 1/1994 | Colgan et al. | |
| 5,298,091 A | 3/1994 | Edwards, III et al. | |
| 5,378,506 A | 1/1995 | Imai et al. | |
| 5,482,611 A | 1/1996 | Helmer et al. | |
| 5,622,608 A | 4/1997 | Lanford et al. | |
| 5,654,233 A | 8/1997 | Yu | |
| 5,656,860 A | 8/1997 | Lee | |
| 5,766,379 A | 6/1998 | Lanford et al. | |

(Continued)

FOREIGN PATENT DOCUMENTS

EP 0 692 551 A1 * 1/1996

(Continued)

OTHER PUBLICATIONS

Schumacher Products, TDEAT (Tetrakis-diethylamino Titanium), Electronic Grade, www.schumacher.com/tdeat.html, printed Jun. 5, 2001, 1 page.

(Continued)

*Primary Examiner*—Rodney G McDonald
(74) *Attorney, Agent, or Firm*—Weaver Austin Villeneuve & Sampson LLP (57) ABSTRACT

Disclosed are apparatus and method embodiments for achieving etch and/or deposition selectivity in vias and trenches of a semiconductor wafer. That is, deposition coverage in the bottom of each via of a semiconductor wafer differs from the coverage in the bottom of each trench of such wafer. The selectivity may be configured so as to result in punch through in each via without damaging the dielectric material at the bottom of each trench or the like. In this configuration, the coverage amount deposited in each trench is greater than the coverage amount deposited in each via.

25 Claims, 8 Drawing Sheets

U.S. PATENT DOCUMENTS

| | | | |
|---|---|---|---|
| 5,789,027 A | 8/1998 | Watkins et al. | |
| 5,904,565 A | 5/1999 | Nguyen et al. | |
| 5,969,422 A | 10/1999 | Ting et al. | |
| 5,985,762 A | 11/1999 | Geffken et al. | |
| 6,037,257 A | 3/2000 | Chiang et al. | |
| 6,046,108 A | 4/2000 | Liu et al. | |
| 6,074,544 A | 6/2000 | Reid et al. | |
| 6,077,780 A | 6/2000 | Dubin | |
| 6,080,285 A | 6/2000 | Liu et al. | |
| 6,093,966 A | 7/2000 | Venkatraman et al. | |
| 6,099,702 A | 8/2000 | Reid et al. | |
| 6,110,346 A | 8/2000 | Reid et al. | |
| 6,114,238 A | 9/2000 | Liao | |
| 6,120,641 A | 9/2000 | Stevens et al. | |
| 6,124,203 A | 9/2000 | Joo et al. | |
| 6,126,798 A | 10/2000 | Reid et al. | |
| 6,139,712 A | 10/2000 | Patton et al. | |
| 6,147,000 A | 11/2000 | You et al. | |
| 6,156,167 A | 12/2000 | Patton et al. | |
| 6,159,354 A | 12/2000 | Contolini et al. | |
| 6,159,857 A | 12/2000 | Liu et al. | |
| 6,162,344 A | 12/2000 | Reid et al. | |
| 6,179,973 B1* | 1/2001 | Lai et al. | 204/192.12 |
| 6,179,983 B1 | 1/2001 | Reid et al. | |
| 6,193,854 B1 | 2/2001 | Lai et al. | |
| 6,200,893 B1 | 3/2001 | Sneh | |
| 6,203,613 B1 | 3/2001 | Gates et al. | |
| 6,217,716 B1 | 4/2001 | Fai Lai | |
| 6,221,757 B1 | 4/2001 | Schmidbauer et al. | |
| 6,228,754 B1 | 5/2001 | Iacoponi et al. | |
| 6,235,163 B1 | 5/2001 | Angelo et al. | |
| 6,249,055 B1 | 6/2001 | Dubin | |
| 6,251,242 B1 | 6/2001 | Fu et al. | |
| 6,271,591 B1 | 8/2001 | Dubin et al. | |
| 6,274,008 B1 | 8/2001 | Gopalraja et al. | |
| 6,277,249 B1 | 8/2001 | Gopalraja et al. | |
| 6,280,597 B1 | 8/2001 | Kashiwada et al. | |
| 6,287,977 B1 | 9/2001 | Hashim et al. | |
| 6,333,547 B1 | 12/2001 | Tanaka et al. | |
| 6,342,448 B1 | 1/2002 | Lin et al. | |
| 6,350,353 B2 | 2/2002 | Gopalraja et al. | |
| 6,387,805 B2 | 5/2002 | Ding et al. | |
| 6,391,785 B1 | 5/2002 | Satta et al. | |
| 6,395,642 B1 | 5/2002 | Liu et al. | |
| 6,402,907 B1* | 6/2002 | Rich | 204/192.17 |
| 6,417,094 B1 | 7/2002 | Zao et al. | |
| 6,440,854 B1 | 8/2002 | Rozbicki | |
| 6,492,262 B2 | 12/2002 | Uzoh | |
| 6,500,762 B2 | 12/2002 | Hashim et al. | |
| 6,541,374 B1 | 4/2003 | de Felipe et al. | |
| 6,554,914 B1 | 4/2003 | Rozbicki et al. | |
| 6,566,246 B1 | 5/2003 | de Felipe et al. | |
| 6,589,887 B1 | 7/2003 | Dalton et al. | |
| 6,607,977 B1 | 8/2003 | Rozbicki et al. | |
| 6,607,982 B1 | 8/2003 | Powell et al. | |
| 6,613,199 B1* | 9/2003 | Tobin et al. | 204/192.12 |
| 6,642,146 B1 | 11/2003 | Rozbicki et al. | |
| 6,652,718 B1* | 11/2003 | D'Couto et al. | 204/192.3 |
| 6,656,841 B1 | 12/2003 | Kim | |
| 6,673,716 B1* | 1/2004 | D'Couto et al. | 438/656 |
| 6,706,155 B2 | 3/2004 | Morimoto et al. | |
| 6,764,940 B1 | 6/2004 | Rozbicki et al. | |
| 6,758,947 B2 | 7/2004 | Chiang et al. | |
| 6,784,096 B2 | 8/2004 | Chen et al. | |
| 6,841,044 B1 | 1/2005 | Ruzic | |
| 6,919,275 B2 | 7/2005 | Chiang et al. | |
| 6,949,457 B1 | 9/2005 | Fiordalice et al. | |
| 7,030,031 B2 | 4/2006 | Wille et al. | |
| 7,037,830 B1 | 5/2006 | Rumer et al. | |
| 7,048,837 B2 | 5/2006 | Somekh et al. | |
| 7,074,714 B2 | 7/2006 | Chiang et al. | |
| 7,186,648 B1 | 3/2007 | Rozbicki et al. | |
| 2002/0000382 A1 | 1/2002 | Morrissey et al. | |
| 2002/0041028 A1 | 4/2002 | Choi et al. | |
| 2003/0034244 A1 | 2/2003 | Yasar et al. | |
| 2005/0020080 A1 | 1/2005 | Chiang et al. | |
| 2005/0211545 A1 | 9/2005 | Cerio, Jr. et al. | |
| 2005/0252765 A1 | 11/2005 | Zhang et al. | |
| 2005/0255690 A1 | 11/2005 | Chen et al. | |
| 2005/0255691 A1 | 11/2005 | Ding et al. | |
| 2005/0266682 A1 | 12/2005 | Chen et al. | |
| 2005/0272254 A1 | 12/2005 | Ding et al. | |
| 2006/0014378 A1 | 1/2006 | Aggrawal et al. | |
| 2006/0024953 A1 | 2/2006 | Rao et al. | |
| 2006/0030151 A1 | 2/2006 | Ding et al. | |
| 2006/0057843 A1 | 3/2006 | Chen et al. | |
| 2006/0207873 A1 | 9/2006 | Fu | |

FOREIGN PATENT DOCUMENTS

| | | |
|---|---|---|
| JP | 11-186273 | 9/1999 |

OTHER PUBLICATIONS

Sun et al., Suppression of Cobalt Silicide Agglomeration Using Nitrogen (N2+) Implantation, IEEE Electron Device Letters, vol. 19, No. 5, May 1998, pp. 163-166.

Ashanti et al., "A New Hollow-Cathode Magnetron Source for 0.10. mu.m Copper Applications", Journal of Vacuum Science and Technology, A 18(4) Jul./Aug. 2000 p. 1546.

Cohen et al., "Reactive Preclean Technology for Nonphysical Copper Oxide Reduction for Advanced CU Interconnet", Jun. 16-Jun. 18, 1998, VMIC Conference, pp. 91 and 93.

Jian Li and J. W. Mayer and E. G. Colgan, "Oxidation and Protection in Copper and Copper Alloy Thin Films", J. Appl. Phys. 70 (5), Sep. 1, 1991, pp. 2820-2827.

Ding et al., "Observation of Reduced Oxidation Rates for Plasma-Assisted CVD Copper Films", Mat. Res. Soc. Symp. Proc., vol. 309, 1993 pp. 445-460.

Klawuhn et al., "Ionized Physical-vapor deposition Using a Hollow-Cathode Magnetron Source for Advanced Metallization", J. Vac, Sci, Technol. A18(4), Jul./Aug. 2000, pp. 1546-1549.

M. Zinke-Allmang, "Phase Separation on Solid Surfaces: Nucleation, Coarsening and Coalescence Kinetics".

Peijun Ding, et al., "Copper Barrier, Seed Layer and Planarization Technologies," VMIC Conference, Jun. 10-12, 1997, pp. 87-92.

Tarek Suwwan de Felipe, et al., "Electrical Stability and Microstructural Evolution in Thin Films of High Conductivity Copper Alloys," IEEE, Jun. 1999, pp. 293-295.

Cho et al., "Factors Affecting Passivation and Resistivity of Cu(Mg) Alloy Film," Materials Research Society Symposium Proc. vol. 564, 1999, pp. 353-358.

Murarka et al., "Copper Metallization for ULSI and Beyond," Critical Reviews in Solid State and Materials Sciences, 1995, pp. 87-124.

Braeckelmann et al. "Integration and Reliability of Copper Magnesium Alloys for Multilevel Interconnects," IEEE, Feb. 2000, pp. 236-238.

Arcot et al., "Intermetallic Formation in Copper/Magnesium Thin Films—kinetics, Nucleation and Growth, and Effect of Interfacial Oxygen," J. Appl. Phys. 76(9), Nov. 1, 1994, pp. 5161-5170.

Ding et al., "Effects of the addition of small amounts of Al to copper: Corrosion, resistivity, adhesion, morphology, and diffusion," J. Appl. Phys. 75(7), Apr. 1994, pp. 3627-3631.

T. Suwwan de Felipe et al., "Bias-temperature stability of the Cu(Mg)/SiO.sub.2/p-Si metal-oxide-semiconductor capacitors," J. Vac. Sci. Technol. B 15(6), Nov./Dec. 1997, pp. 1987-1986.

Chen et al. "Low Temperature Plasma-Assisted Chemical Vapor Deposition of Tantalum Nitride form Tantalum Pentabromide for Copper Metallization," Jan./Feb. 1999, J. Vac. Sci. Technol., B 17(1), pp. 182-185.

Cheng et al., "Directional Deposition of Cu into Semiconductor Trench Structures Using Ionized Magnetron Sputtering," Mar./Apr. 1995, J. Vac. Sci. Technol., B 13(2), pp. 203-208.

Cho et al., "Remote Plasma-Assisted Metal Organic Chemical Vapor Deposition of Tantalum Nitride Thin Films with Different Radicals," Dec. 1998, Jpn. J. Appl. Phys., vol. 37.

Endle et al., "X-Ray Photoelectron Spectroscopy Study on TiN Films Produced with Tetrakis (dimenthylamido)Titanium and Selected N-Containing Precursors on SiO.sub.2," May/Jun. 1998, J. Vac. Sci. Technol., A 16(3), pp. 1262-1267.

Green et al., "Determination of Flux Ionization Fraction Using a Quartz Crystal Microbalanace and a Gridded Energy Analyzer in an Ionized Magnetion Sputtering System," Dec. 1997, Rev. Sci. Instrum., 68 (12), pp. 4555-4560.

Han et al., "Barrier Metal Properties of Amorphous Tantalum Nitride Thin Films Between Platinum and Silicon Deposited Using Remote Plasma Metal Organic Chemical Vapor Method," May 1998, Jpn. J. Appl. Phys., vol. 37 (1998), Pt. 1, No. 5A, pp. 2646-2651.

Yahden et al., "Characterization of Magnetron-Sputtered Partially Ionized Aluminium Deposition," Mar./Apr. 1998, J. Vac. Sci. Technol., A 16(2), pp. 624-627.

Hayden et al., "Helion Plasma Source for Ionized Physical Vapor Deposition," 1999, Surface and Coatings Technology, 120-121 (1999), pp. 401-404.

Lee et al., "The Failure Mechanism of MOCVD TiN Diffusion Barrier at High Temperature," 1996, Mat. Res. Soc. Symp. Proc., vol. 324, pp. 279-284.

Lucovsky et al., "Formation of Thin Films by Remote Plasma Enhanced Chemical Vapor Deposition (Remote PECVD)," Feb. 1990, in Handbook of Plasma Processing Technology, eds. Rossnagel, Cuomo and Westwood, Noyes Publications, pp. 387-408.

Musher et al., Atmospheric Pressure Chemical Vapor Deposition of Titanium Nitride from Tetrakis (diethylamido) Titanium and Ammonia, Feb. 1996, J. Electrochem. Soc., vol. 143, No. 2, pp. 736-744.

Peng et al., "Structural and Electrical Properties of Chemical Vapor Deposition Tungsten Overgrowth on Physical Vapor Deposited and Metalorganic Chemical Vapor Deposited TiNAdhesion Layers," Jul./Aug. 1998, J. Vac. Sci. Technol., B 16(4), pp. 2013-2018.

Reif, Rafael, Plasma Enhanced Chemical Vapor Deposition of Thin Films for Microelectronics, Feb. 1990, in Handbook of Plasma Processing Technology, eds: Rossnagel, Cuomo and Westwood, Noyes Publications, pp. 260-284.

Truong, C.M.; Chen, P.J.; Corneille, J.S.; Oh, W.S. and Goodman, D.W., "Low-Pressure Deposition of TiN Thin Films from a Tetrakis (diethylamido) Titanium Precursor," 1995, *J. Phys. Chem.*, 1995, 99, pp. 8831-8842.

Tsai, et al., "Comparison of the Diffusion Barrier Properties of Chemical-Vapor-Deposited TaN and Sputtered TaN Between Cu and Si," May 1996, J. Appl. Phys., 79 (9), pp. 6932-6938.

Danek et al., "Barrier First Method for Single Damascene Trench Applications," Novellus Systems, Inc., U.S. Appl. No. 11/714,465, filed Mar. 5, 2007.

U.S. Office Action mailed Jul. 31, 2002, from U.S. Appl. No. 09/862,539.

U.S. Office Action mailed Sep. 16, 2002, from U.S. Appl. No. 09/776,704.

U.S. Office Action mailed Apr. 22, 2002, from U.S. Appl. No. 09/776,704.

U.S. Final Office Action mailed Apr. 3, 2003, from U.S. Appl. No. 09/816,847.

U.S. Office Action mailed Oct. 4, 2002, from U.S. Appl. No. 09/816,847.

U.S. Office Action mailed Oct. 23, 2002, from U.S. Appl. No. 09/965,472.

U.S. Office Action mailed Oct. 3, 2003, from U.S. Appl. No. 10/412,562.

U.S. Final Office Action mailed Mar. 23, 2006, from U.S. Appl. No. 10/804,353.

U.S. Office Action mailed Oct. 3, 2006, from U.S. Appl. No. 10/804,353.

U.S. Office Action mailed Aug. 28, 2002, from U.S. Appl. No. 09/975,612.

U.S. Office Action mailed Jun. 15, 2004, from U.S. Appl. No. 10/289,237.

U.S. Office Action mailed Dec. 19, 2002, from U.S. Appl. No. 10/121,949.

Dulkin et al., "Deposition of Thin Continuous PVD Seed Layers Having Improved Adhesion to the Barrier Layer," Novellus Systems, Inc., U.S. Appl. No. 11/473,618, filed Jun. 22, 2006.

Dulkin et al., "Method and Apparatus for Controlling Sputtered Flux in PVD Sources," Novellus Systems, Inc., U.S. Appl. No. 11/564,222, filed Nov. 28, 2006.

Kailasam et al., "Resputtering Process for Eliminating Dielectric Damage," Novellus Systems, Inc., U.S. Appl. No. 11/588,586, filed Oct. 26, 2006.

Lu et al., "An Integrated Plasma Equipment-feature Scale Model for Ionized Metal Physical Vapor Deposition", Jun. 2000, University of Illinois (16 pages).

Font et al., "Scaling of Hollow Cathode Magnetrons for Metal Deposition", Oct. 1999, University of Illinois (20 pages).

Rozbicki, R., "Methods and Apparatus for Resputtering Process that Improves Barrier Coverage," Novellus Systems, Inc., U.S. Appl. No. 11/830,777, filed Jul. 30, 2007.

Rozbicki et al., "Multistep Method of Depositing Metal Seed Layers," Novellus Systems, Inc., U.S. Appl. No. 11/701,984, filed Feb. 1, 2007.

Pradhan et al., "Atomic Layer Profiling of Diffusion Barrier and Metal See Layers," Novellus Systems, Inc., U.S. Appl. No. 11/807,179, filed May 24, 2007.

Juliano, D., "Selective Resputtering of Metal Seed Layers," Novellus Systems, Inc., U.S. Appl. No. 11/903,487, filed Sep. 21, 2007.

Viyahendran et al., "Gas Treatment Method and Apparatus to Improve Copper Gap Fill," U.S. Appl. No. 11/131,599, filed May 18, 2005.

Vyvoda et al., "Role of sidewall scattering in featuring profile evolution during $Cl_2$ and HBr plasma etching of silicon," J.Vac. Sci. Technol. B 18(2), Mar./Apr. 2000, pp. 820-833.

Hoekstra et al., "Microtenching resulting from specular reflection during chlorine etching of silicon," J.Vac. Sci. Technol. B 16(4), Jul./Aug. 1998, pp. 2102-2104.

Lane et al., "Feature evolution during plasma etching. II. Polycrystalline silicone etching," J.Vac. Sci. Technol. A 18(1), Jan./Feb. 2000, pp. 188-196.

Rozbicki, R., "A Method of Enhancing Selectivity of Resputtering Process," Novellus Systems, Inc., U.S. Appl. No. 11/977,355, filed Oct. 23, 2007.

Pradhan et al., "Method and Apparatus for Increasing Local Plasma Density in Magnetically Confined Plasma," Novellus Systems, Inc., U.S. Appl. No. 11/807,182, filed May 24, 2007.

Kinder et al., "The Use of Ultra-High Magnetic Fields in Resputter and Plasma Etching," Novellus Systems, Inc., U.S. Appl. No. 11/807,183, filed May 24, 2007.

Dulkin et al., "Methods and Apparatus for Engineering and Interface Between A Diffusion Barrier Layer and A Seed Layer," Novellus Systems, Inc., U.S. Appl. No. 11/807,178, filed May 24, 2007.

* cited by examiner

APPARATUS AND METHODS FOR DEPOSITION AND/OR ETCH SELECTIVITY

BACKGROUND

The present invention relates generally to deposition and/or etching of layers of material on a partially fabricated integrated circuit. More specifically, it relates to deposition of diffusion barrier layers.

Generally, the industry of semiconductor manufacturing involves highly complex techniques for fabricating integrating circuits from semiconductor materials that are layered and patterned onto a substrate, such as silicon, by various process systems. For example, a first process system deposits a layer of material, while another process system etches a pattern in such deposited material.

Miniaturization of integrated circuit (IC) devices demands superior electrical properties from both dielectric and conductive materials used in the manufacturing of an integrated circuit. Traditionally used materials, such as aluminum as a conductor and silicon dioxide as an insulator no longer provide adequate electrical characteristics at the modern level of miniaturization. Therefore, the manufacturers of IC devices are now employing new dielectric materials with lower dielectric constant than silicon dioxide and are increasingly turning to copper as a conductor, due to its low resistivity. The low-k dielectric materials used in the IC device processing include carbon doped silicon dioxide, hydrogenated silicon oxycarbides (SiCOH), fluorine doped silicon dioxide, and organic-containing low-k dielectrics. These materials, due to their low dielectric constants, provide low parasitic capacitance and minimize the "crosstalk" between the interconnects in an integrated circuit. At the same time, they are often porous foam-like materials and are generally more easily damaged during the processing steps than silicon dioxide. The impact of high-energy ions during such processing steps as PVD (physical vapor deposition) often results in undesired effects in a highly porous dielectric.

Figure 1A:
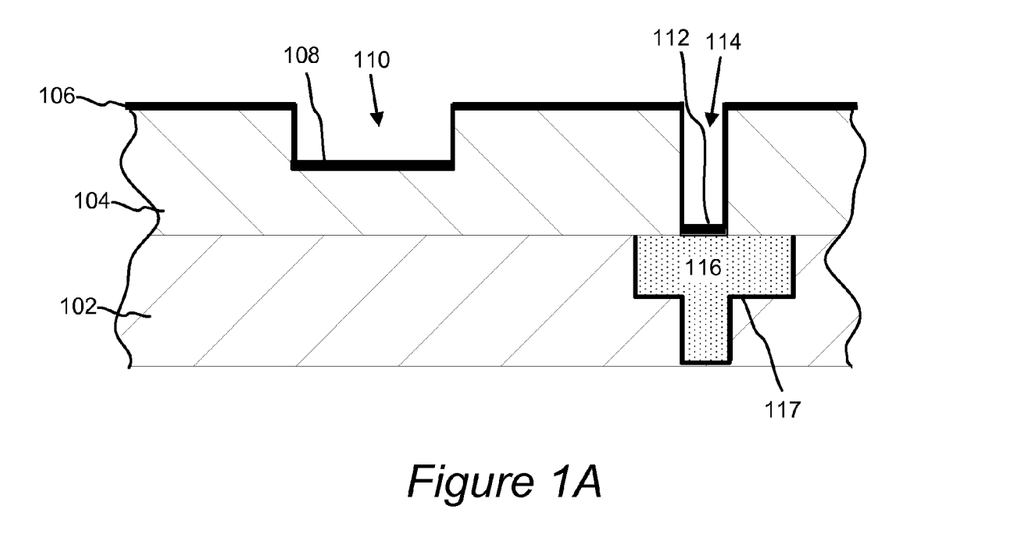
FIGS. 1A and 1B are cross sectional views of a partially formed semiconductor device to illustrate a process that tends to damage highly porous dielectric materials.
Figure 1B:
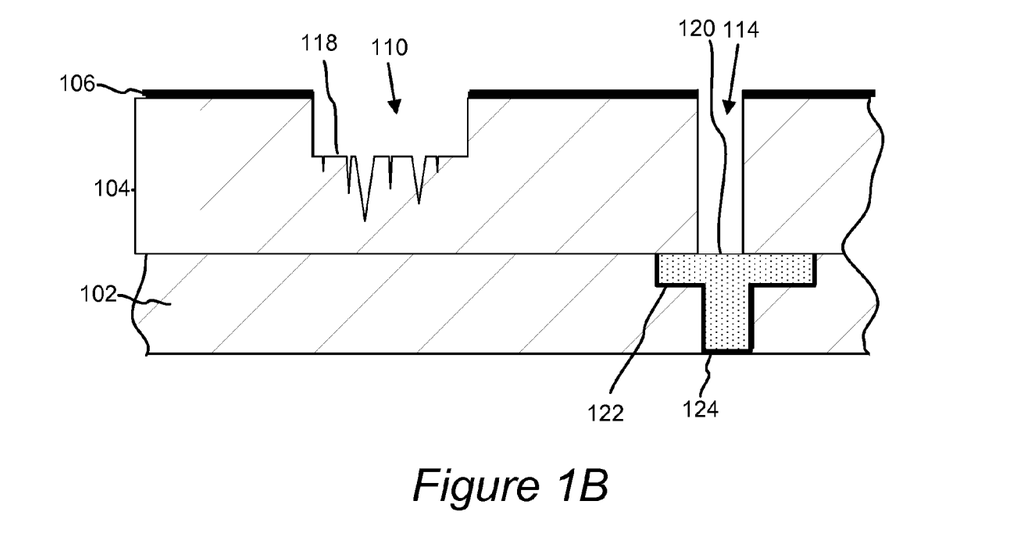

FIGS. 1A and 1B are cross sectional views of a partially formed semiconductor device to illustrate a process that tends to damage highly porous dielectric materials. As shown, a first dielectric layer 102 has already been etched to form a recessed feature into which a conductive copper plug 116 has been formed. The trench and via into which the copper plug is formed is lined with a diffusion barrier layer 117. In a second dielectric layer 104 a trench 110 and a via 114 are formed. A diffusion barrier layer 106 is also formed over the dielectric layer 104. This barrier layer 106 is typically formed with a uniform thickness in both the trench 110 and via 114. That is, barrier portion 108 in the trench 110 has about a same thickness as barrier portion 112 in the via 114.

The barrier material 106 is removed from the bottom surface 112 of the via 114 along with any underlying oxidized copper so as to form a better connection to the conductive line 116 in a subsequent process step. Since the barrier material was deposited uniformly in the trench and the via, cleaning all of the barrier material from the via also results in etching into the dielectric material underneath the trench's barrier layer. FIG. 1A illustrates the partially formed device prior to removal of the barrier material 106 from the trench and via, while FIG. 1B shows the device after removal of the barrier material from the trench and via 114. As shown, although the bottom of the via 120 is cleaned sufficiently to expose the underlying copper material, the dielectric material within the bottom of the trench 118 is damaged during this etch process. As shown, damage is created within the dielectric material beneath the trench. Damage will tend to form in highly porous dielectric materials, such as ultra low k dielectric materials. This damage may lead to adverse effects, such as time dependent dielectric breakdown (TDDB) that then causes device failure.

Accordingly, it would be beneficial to provide improved apparatus and methods for facilitating etching of via features without damaging the dielectric material within trench features or other features of a semiconductor wafer.

SUMMARY OF EMBODIMENTS OF THE INVENTION

Embodiments of the present invention include apparatus and methods for achieving etch and/or deposition selectivity in vias and trenches of a semiconductor wafer. That is, deposition coverage in the bottom of each via of a semiconductor wafer differs from the coverage in the bottom of each trench of such wafer. The selectivity may be configured so as to result in punch through in each via without damaging the dielectric material at the bottom of each trench or the like. In this configuration, the coverage amount deposited in each trench is greater than the coverage amount deposited in each via.

In one embodiment, an apparatus for depositing material on a semiconductor wafer having recessed features, including a plurality of vias and trenches, is disclosed. This apparatus includes generally a process chamber having a target for depositing material onto the semiconductor wafer and a wafer support for holding the wafer in position during deposition of the material. The apparatus further includes a controller configured to sputter material from the target onto the semiconductor wafer under conditions that coat the recessed features and thereby form the layer of material. The wafer is positioned with respect to the target so that a first coverage amount of material deposited in each trench is greater than a second coverage amount of material deposited in each via. In one aspect, the target is three dimensional. In a specific implementation, the target is single piece target and in another implementation is a multiple piece target. In one embodiment, the material is sputtered in each trench substantially simultaneously as in each via.

In another embodiment, the invention pertains to a method for depositing material on a semiconductor wafer having recessed features, including a plurality of vias and trenches. A first coverage amount of material is deposited in each via to coat a bottom of such each via while a second coverage amount of material is deposited in each trench to coat a bottom of such each trench. The depositing of the first and second coverage amounts are selectively controlled such that a ratio of the second coverage amount over the first coverage amount is greater than about 1.5. In a specific embodiment, the first coverage amount of material is deposited in substantially only a direction that is substantially normal to a surface of the wafer and the second coverage amount of material is deposited in a plurality of directions in relation to the wafer surface, including a normal direction and a substantially non-normal angle.

In an alternative embodiment, the invention pertains to another apparatus for depositing material on a semiconductor wafer having recessed features, including a plurality of vias and trenches. The apparatus includes a process chamber having a target for sputtering the material onto the semiconductor wafer and a wafer support for holding the wafer in position during deposition of the material. The apparatus further includes a controller that is configured to perform the operations of the method embodiment that are described above.

These and other features and advantages of the present invention will be presented in more detail in the following specification of the invention and the accompanying figures which illustrate by way of example the principles of the invention.

BRIEF DESCRIPTION OF THE DRAWINGS

The present invention is illustrated by way of example, and not by way of limitation.

EXAMPLE EMBODIMENTS OF THE INVENTION

Reference will now be made in detail to a specific embodiment of the invention. An example of this embodiment is illustrated in the accompanying drawings. While the invention will be described in conjunction with this specific embodiment, it will be understood that it is not intended to limit the invention to one embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Figure 2A:
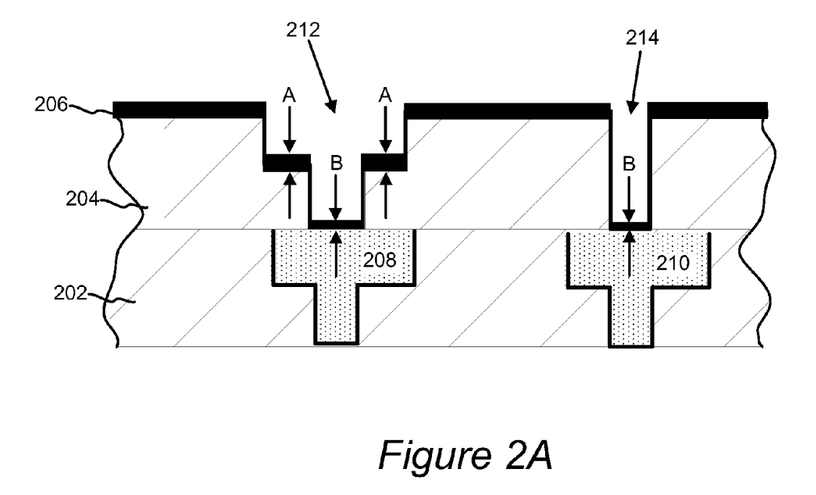
FIGS. 2A and 2B illustrate selective deposition for vias and trenches in accordance with an example application of the present invention.
Figure 2B:
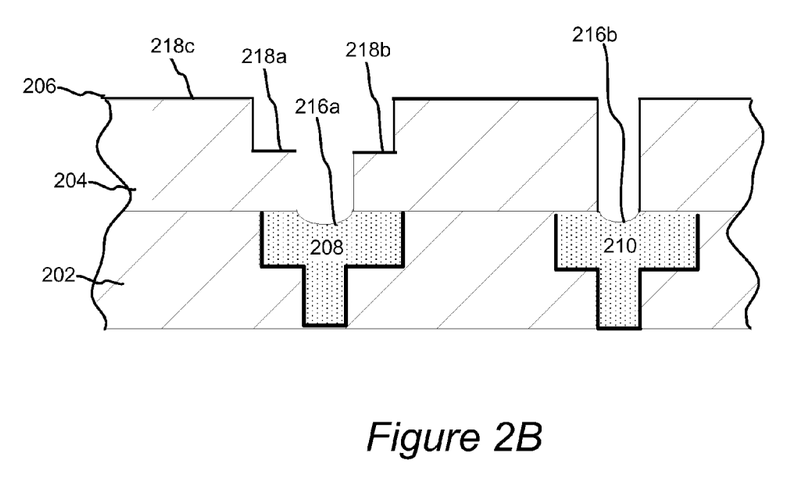

In general, particular embodiments of the present invention provide apparatus and methods for achieving etch and/or deposition selectivity in vias and trenches of a semiconductor wafer. FIGS. 2A and 2B illustrate selective deposition for vias and trenches in accordance with an example illustration of the present invention. FIG. 2A is a cross sectional view of a partially formed semiconductor device illustrating selective deposition in vias and trenches in accordance with one embodiment of the present invention. As shown, a first conductive plug 208 and a second conductive plug 210 are formed in a first dielectric layer 202. A second dielectric layer 204 includes a first recessed feature 212 and a second recessed feature 214. The first recessed feature 212 is in the form of a trench and a via, while the second recessed feature 214 is in the form of a via.

During a selective deposition process, a diffusion barrier layer 206, such as Ta or TaN, is deposited over the second dielectric layer 204. The selectivity results in at least two different coverage amounts for the trenches and the vias. As shown, each bottom surface of each trench has a coverage amount equal to A, while each bottom surface of each via has a coverage amount equal to B. Accordingly, a ratio of coverage for the trench and the via is defined as:

$$S_D = \frac{A}{B}$$

The SD ratio may be selected to be significantly greater than 1.0 for deposition of the barrier material so that A is greater than B, or rather, the amount of deposition coverage in each trench, as well as other low aspect ratio features, is greater than the amount of coverage in each via. As shown, deposition selectivity is configured to result in a barrier thickness A in the trench bottom surfaces that is significantly higher than the B thickness in the via bottoms.

While the term "deposition" includes a wide range of possible deposition and etching activities across the wafer, it is generally understood to imply that a net deposition of material occurs at the bottom of a recess being covered (e.g. a via and/or trench). Whether or not there is a net etch or deposition at other regions of the workpiece does not change the fact that deposition is taking place. Similarly, the terms "etching" and "resputtering" used with respect to a recessed feature include a wide range of both deposition and etching activities and generally imply a net etching or removal of material from the bottom of such recess (e.g., via or trench).

As shown in FIG. 2B, when the barrier is etched away, for example, by a resputtering process, the relative thickness of B and A are such that each via is cleaned and a portion of the underlying plugs 208 and 210 is etched to thereby form recesses 216a and 216b while a small amount of barrier remains on the bottom surface of the trench (e.g., 218a and 218b), as well as the other low aspect features such as unpatterned, field area 218c. Anchor formation is optional and need not be formed in the via bottom surfaces. That is, the via bottom surface may merely be cleaned. Since the dielectric material 204 remains unetched during etching of the vias, the dielectric material can remain undamaged.

The deposition and subsequent resputtering process are most often used, respectively, for deposition and resputtering of the diffusion barrier layer, but can also be employed in the deposition or etch-back of other wafer materials such as conductive metal layers; e.g., copper seed layers. That is, selective deposition of trenches and vias can be applied to any suitable material. Diffusion barrier materials commonly subjected to deposition and subsequent resputtering include but are not limited to tantalum, titanium, tungsten, ruthenium, cobalt, solid solutions of these metals and nitrogen and binary nitrides (e.g. Ta, $TaN_x$, Ti, $TiN_x$, W, $WN_x$, Ru, or Co). Copper is also a commonly resputtered material.

An Ionized Physical Deposition (iPVD) process may be used for deposition and resputtering of a material. That is, a same iPVD chamber, as described further below, may be used to both deposit and remove a material with respect to a recessed feature. An important characteristic of iPVD processes is the etch rate to deposition rate ratio (E/D). It should be understood, that both etching and depositing processes are occurring simultaneously during deposition or resputter. Deposition is the result of inert gas particles bombarding the target, and sputtering target material (neutral or ionic) onto the wafer surface. Etching is the result of inert gas particles bombarding the wafer. In some embodiments of this invention, ionized metal may be used together with ionized gas for resputtering of wafer materials.

An etch and/or deposition processes can be controlled by modulating the power at the target and at the wafer pedestal. For example, to achieve low E/D ratio needed for deposition, the power at the target is increased and the bias at the wafer is decreased or turned off. This configuration causes the inert gas particles to be directed towards the target, leading to deposition of the target material on the wafer. The DC target power used for deposition step ranges from 10 to 70 kW. The bias power during deposition can range from about 0 to about 3000 W, more preferably from about 0 to about 1200 W. Conversely, if the power at the target is decreased while the power at the wafer pedestal (bias) is increased, the inert gas particles are directed to the wafer, leading to net etching of the wafer layer (resputter). Commonly employed DC target power for the resputter process is 1-8 kW, preferably 1-6 kW. The bias power for resputtering can range from about 100 to about 3000 W, preferably from about 600 to about 1500 W, and even more preferably from about 900 to about 1200 W.

Figure 3:
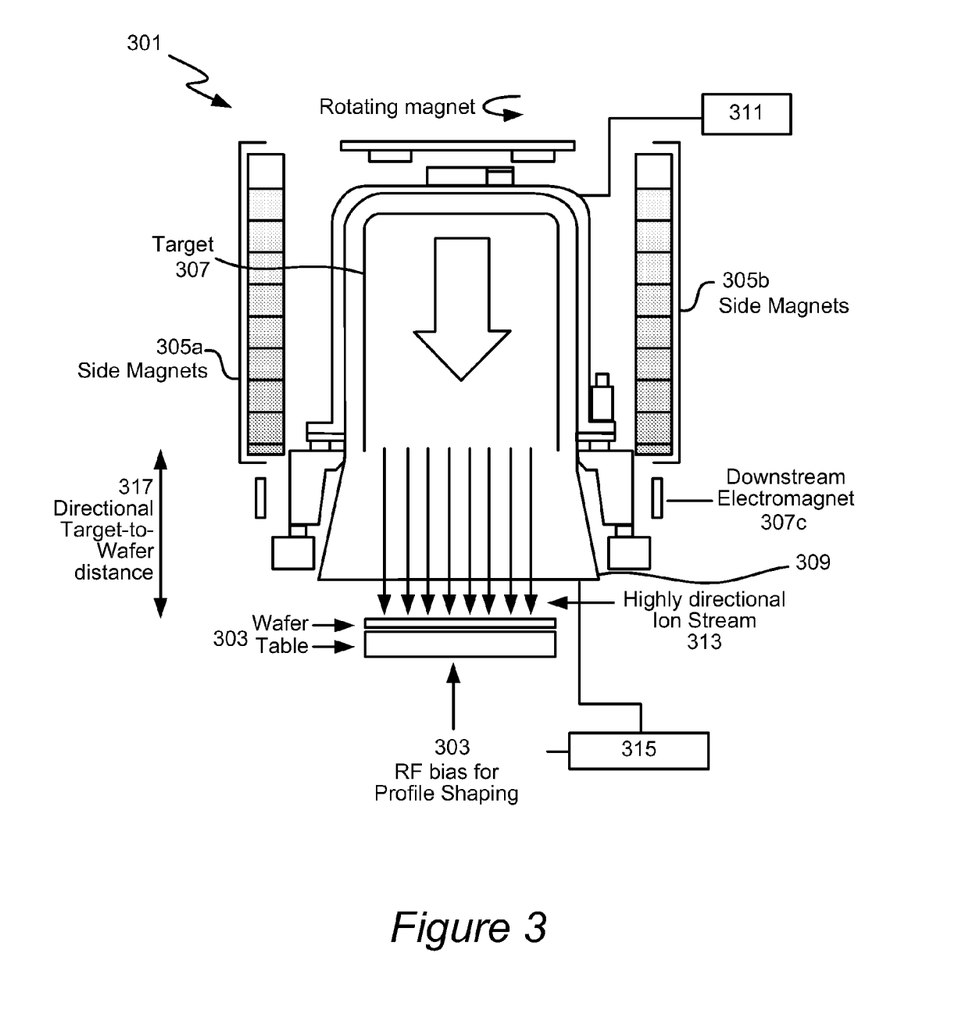
FIG. 3 illustrates a hollow cathode magnetron (HCM) apparatus in which an ionized PVD process is implemented, wherein material is deposited in a substantially unidirectional or directional manner.

FIG. 3 illustrates a hollow cathode magnetron (HCM) apparatus in which an ionized PVD (iPVD) process is implemented, wherein material is deposited in a substantially unidirectional or directional manner. FIG. 3 will also be used to describe in detail components that can be utilized for a general iPVD process, while later described system figures will merely illustrate a limited set of components. The HCM apparatus has two main components, the source 301, in which a plasma is created and maintained, and the RF bias electrostatic chuck (ESC) pedestal 303, which secures the wafer and applies an RF bias on the wafer, if needed. In this example, the source 301 contains several electromagnets 305a-305c, a cathode target 307 and a shield 309, often referred to as an anode. The cathode target 307 generally has a hollow cup-like or bell shape so that plasma formed in the source can be concentrated within this hollow region. The cathode target 307 also serves as a sputter target and is, therefore, made of a metal material such as tantalum, which is to be deposited onto a substrate.

An inert gas, such as argon, is introduced through a gas inlet into the hollow region of the cathode target 307 powered by a DC source to create a plasma. The pump 315 is positioned to evacuate or partially evacuate the process chamber. The control of pressure in the process chamber can be achieved by using a combination of gas flow rate adjustments and pumping speed adjustments, making use of, for example, a throttle valve or a baffle plate. Alternatively, pressure above the wafer can be controlled by varying the height of the wafer pedestal 303. An intense magnetic field is produced by electromagnets 305a-305b within the cathode target region. Additional electromagnets 305c are arranged downstream of the cathode target so that different currents can be applied to each electromagnet, thereby producing an ion and/or neutral particle flux and a controlled deposition and/or etch rate. A floating shield 309, existing in equilibrium with the floating plasma potential, is used, in conjunction with the source electromagnets to shape the plasma distribution at the target mouth. A stream of ions and/or particles is directed to the surface of the wafer, as shown by arrows on FIG. 3. The ESC pedestal 303 holds the wafer substrate in place and can apply a RF bias to the wafer substrate. The ion and/or neutral particle energy, and therefore the deposition and/or etch rate can also be controlled by the pedestal RF bias. An additional function of the ESC pedestal is to provide wafer temperature control during deposition and resputtering. In a typical process the pedestal temperature can vary in the range of about −50 to 600° C. In practice, the wafer pedestal may be cooled down to temperatures of about −40 to −20° C. while the shields of an apparatus are kept at a higher temperature of about 25 to 500° C., preferably about 100 to 200° C. Typically, argon or helium backside gas is used to provide thermal coupling between the substrate and the ESC.

In certain embodiments, a system controller 311 is employed to control process conditions during deposition and resputter, insert and remove wafers, etc. The controller will typically include one or more memory devices and one or more processors. The processor may include a CPU or computer, analog and/or digital input/output connections, stepper motor controller boards, etc. Alternatively, the controller may contain hardware devices, such as ASIC's, that are configured to manage the process conditions.

In certain embodiments, the controller controls all of the activities of the deposition apparatus. The system controller may execute system control software including sets of instructions for controlling the timing, mixture of gases, chamber pressure, chamber temperature, wafer temperature, RF power levels, wafer chuck or susceptor position, and other parameters of a particular process. Other computer programs stored on memory devices associated with the controller may be employed in some embodiments.

Typically there will be a user interface associated with controller 311. The user interface may include a display screen, graphical software displays of the apparatus and/or process conditions, and user input devices such as pointing devices, keyboards, touch screens, microphones, etc.

In one implementation, the computer program code for controlling the deposition and resputtering processes can be written in any conventional computer readable programming language: for example, assembly language, C, C++, Pascal, Fortran or others. Compiled object code or script is executed by the processor to perform the tasks identified in the program.

The controller parameters relate to process conditions such as, for example, wafer position, process gas composition and flow rates, temperature, pressure, plasma conditions such as RF and DC power levels and frenquency, cooling gas pressure, and chamber wall temperature. At least a portion of these parameters may be provided to the user in the form of a recipe, and may be entered utilizing the user interface.

Signals for monitoring the process may be provided by analog and/or digital input connections of the system controller. The signals for controlling the process are output on the analog and digital output connections of the deposition apparatus.

In one embodiment, the system software may be designed or configured in many different ways. For example, various chamber component subroutines or control objects may be written to control operation of the chamber components necessary to carry out the inventive deposition processes.

Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet, target, and/or separatrix, which is explained further below. A process gas control program may include code for controlling gas composition and flow rates and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck. A plasma control program may include code for setting RF and DC power levels applied to the process electrodes at the target and the wafer chuck.

Examples of chamber sensors that may be monitored during deposition and/or resputtering include pedestal or chuck positioning sensors, mass flow controllers, pressure sensors such as manometers, and thermocouples located in pedestal or chuck. Appropriately programmed feedback and control algorithms may be used with data from these sensors to maintain desired process conditions.

As shown in this HCM configuration, the wafer is positioned a distance 317 from the target that results in the wafer receiving a mostly unidirectional stream of ions and/or neutral particles 313 for deposition. This distance is referred to as a "Directional Distance." For instance, a typical distance is greater than 20 cm from the bottom edge of the target 307 and the wafer will cause the wafer to only receive ions and/or neutral particles that are mostly directed at a normal angle with respect to the wafer surface. The reason for this is that the ions and/or neutral particles sputtered from the sidewalls of the target at shallow or non-normal angles mostly miss the wafer when the wafer is positioned far from the target, while a significant portion of neutral particles that are sputtered from the top surface of the target at a normal angle to the wafer surface reach the wafer surface. Consequently, a mostly unidirectional stream will tend to cover the bottoms of the vias and trenches (as well as the field and other wafer features) at about the same rate and thickness as shown in FIG. 2A, for example. This uniform coverage may later result in time dependent dielectric breakdown (TDDB) after the trenches are etched at the same rate as the vias during a via cleaning process. TDDB is a measure of interconnect reliability that is a function of the dielectric and barrier metal integrity.

One way to minimize this TDDB effect is to prevent dielectric damage during the etching step of the barrier deposition. This may be accomplished by providing a selective deposition coverage amount for the trenches and the vias. To achieve this selectively, the wafer may be positioned closer to the target so that more shallow or oblique angled (or rather non-normal angles) neutral particles reach the trench bottom surfaces, as compared to the via bottom surfaces, during the deposition process. Any suitable configuration may be utilized so as to have oblique angled or non-normal angled neutral particles to reach the trench surfaces.

Figure 4A:
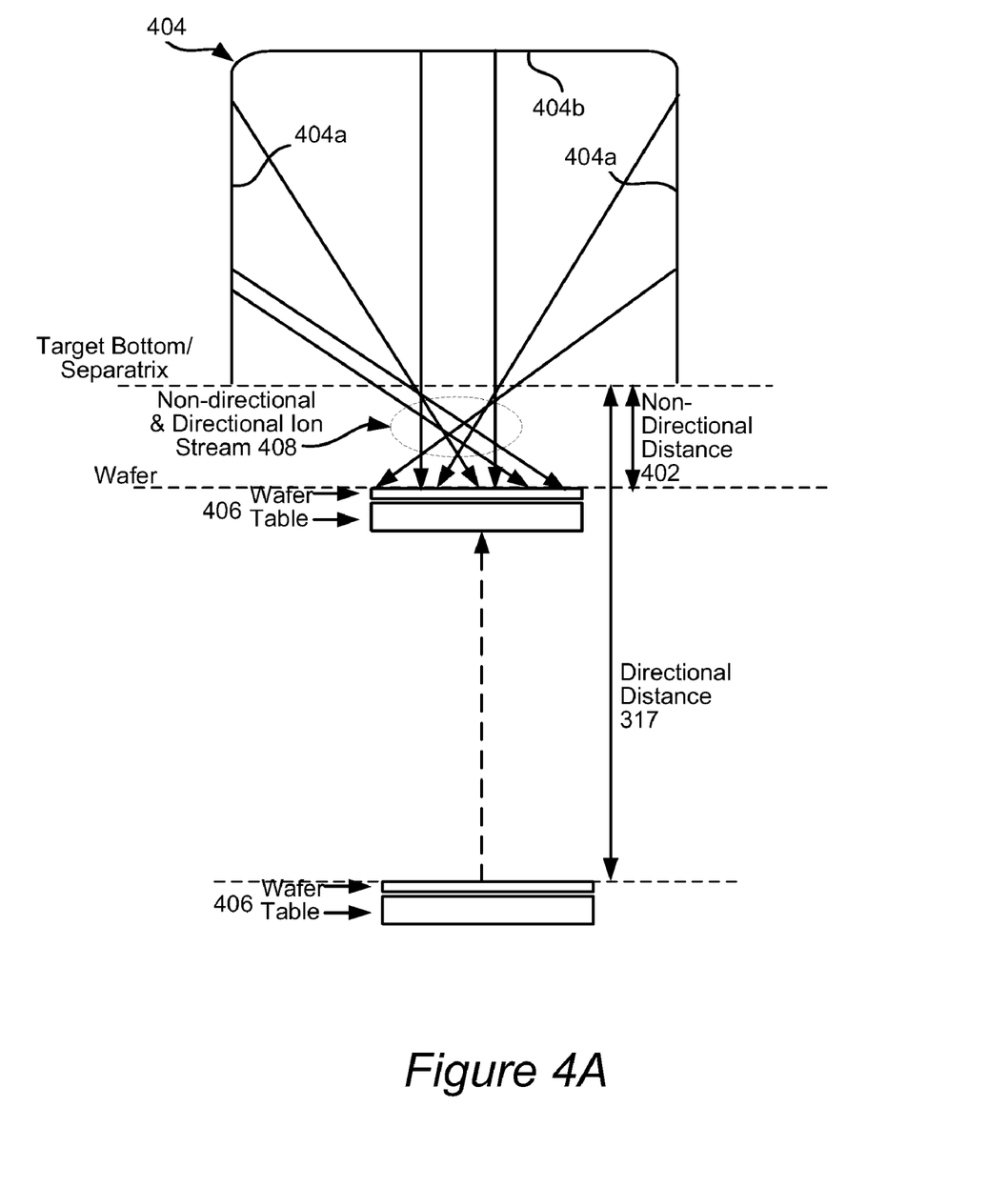
FIG. 4A illustrates an HCM that is configured to provide selective deposition of vias and trenches in accordance with a first implementation of the present invention.

FIG. 4A illustrates an HCM that is configured to provide selective deposition of vias and trenches in accordance with a first implementation of the present invention. As shown, the wafer and its support table 406 have been moved so as to achieve a "Non-Directional Distance" 402 from the wafer to a bottom edge of the target 404 and/or the separatrix, as explained further below. This Non-Directional Distance 402 results in neutral particles having non-directional or oblique angles 408, with respect to the wafer surface, being impinged across the wafer field and recessed features having low aspect ratios, such as trenches.

The HCM system includes a three dimensional target that is formed from a single piece of material. In this example, the single piece target is bell shaped with ions and/or neutral particles being sputtered from the interior of the bell in a deposition process. This arrangement provides a simplified design since the target is formed from a single piece, as opposed to a multiple piece target. For instance, a single piece target does not require precise positioning of multiple target pieces with respect to one another to achieve a particular deposition result.

In the example of FIG. 4A, the three dimensional and bell shaped target includes interior sidewall surfaces 404$a$ and top surface 404$b$. When the wafer is positioned closer to the target, there is a position where the wafer receives ions and/or neutral particles that are sputtered from the sidewall surfaces so that at least a portion of the non-normal angled neutral particles are sputtered into each trench and not in each via. This effect would tend to occur for any three dimensional target having sidewall surfaces (e.g., the two piece target of FIG. 4B) that are perpendicular or angled towards the wafer surface so as to cause non-normal angled ions and/or neutral particles to sputter from its surface. A greater amount of neutral particles sputtered from the sidewall surfaces reach the trench bottom surfaces than the via bottom surfaces. In one embodiment, the material deposited in each via comprises mostly ions and/or neutral particles from the top surface 404$b$ of the target and sputtered ions and/or neutral particles that reach each via's bottom surface are, hence, mostly normal to the wafer surface.

Figure 4B:
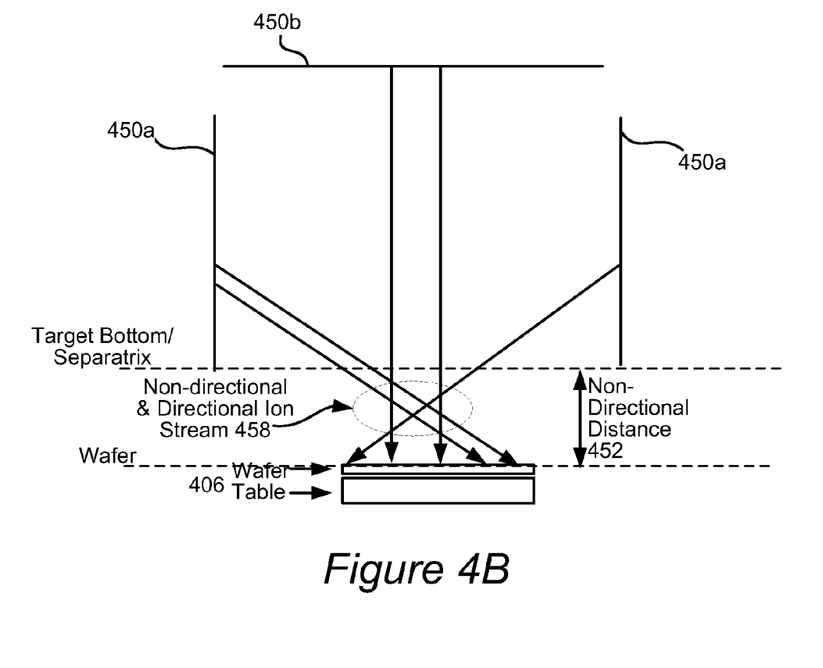
FIG. 4B illustrates an ionized PVD system having a two piece target and is configured to provide selective deposition of vias and trenches in accordance with a second implementation of the present invention.

Although an HCM type iPVD system having a bell shaped target is illustrated in FIG. 4A, of course other types of three dimensional target shapes may be utilized so as to have non-directional or non-normal angled neutral particles deposited in the trench bottom surfaces and substantially not in the via bottom surfaces. FIG. 4B illustrates an iPVD system having a two-piece target and is configured to provide selective deposition of vias and trenches in accordance with a second implementation of the present invention. In this system, the target has a top planar portion 450$b$ and a sidewall portion 450$a$ that has a cylindrical shape (shown in cross section). In this example, the top portion 450 is substantially parallel to the wafer surface on which the recessed features are formed and the sidewall portion 450$a$ is substantially perpendicular to such wafer surface. In this configuration, the wafer can also be positioned at a distance from the target bottom edge or separatrix that results in non-directional or oblique angle (or non-normal) neutral particles being deposited on the trench bottom surfaces and substantially not on the via bottom surfaces so that the SD ratio for trench to via coverage results in via punch-through when resputtering the material from the via bottom surface while minimizing damage to the dielectric material underlying the trench material.

In any of the described embodiments, the separatrix or null field position that occurs during a deposition and/or etch process may be positioned in any suitable position with respect to the target. In general, an electric field is typically formed along the sidewall of the target using the side magnets to generate positive and negative polarities along the sidewall of the target. In the examples of FIGS. 4A and 4B, the separatrix is generated along the bottom edge of the target so as to maximize the charged particle confinement. In these examples, the wafer may be positioned at a non-directional distance that is greater than 0 and less than 10 cm from the separatrix and bottom edge of the target.

Figure 4C:
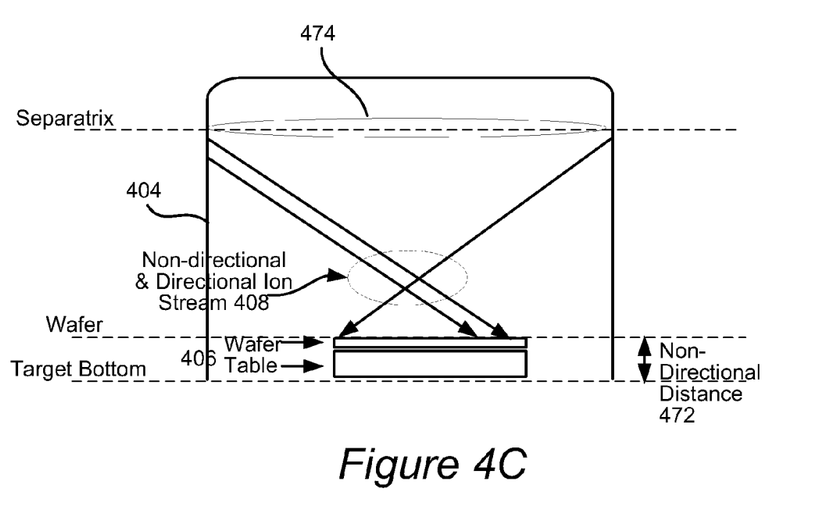
FIG. 4C illustrates an alternative configuration of an HCM, in which the separatrix (i.e., null field position) is formed high in the target, so as to provide selective deposition of vias and trenches in accordance with a third implementation of the present invention.

In other embodiments, the separatrix may be formed at a position along higher up in the target. FIG. 4C illustrates an alternative configuration of an HCM, in which the separatrix is positioned high in the target, so as to provide selective deposition of vias and trenches in accordance with a third implementation of the present invention. As shown, the separatrix 474 may be generated in the top half of the sidewall of the target 404. Accordingly, the wafer may be positioned adjacent to at least a portion of the sidewall of the target 404, such as at the bottom edge of the target or even inside the interior of the target (as shown) and still receive non-directional neutral particles within its trenches. The non-directional distance may be defined as the distance 472 from the wafer to the bottom edge of the target. When the separatrix is positioned at a distance of about −5 to about 5 cm from the bottom edge of the target, which is closest to the wafer, the wafer may be positioned at a distance 472 of about −1 cm to about 10 cm with respect to the bottom edge of the target with positive numbers being exterior to the target interior and negative numbers being interior to the target. More preferably, the wafer is positioned at a distance 472 of about 5 to 10 cm from the bottom target edge.

Figure 5:
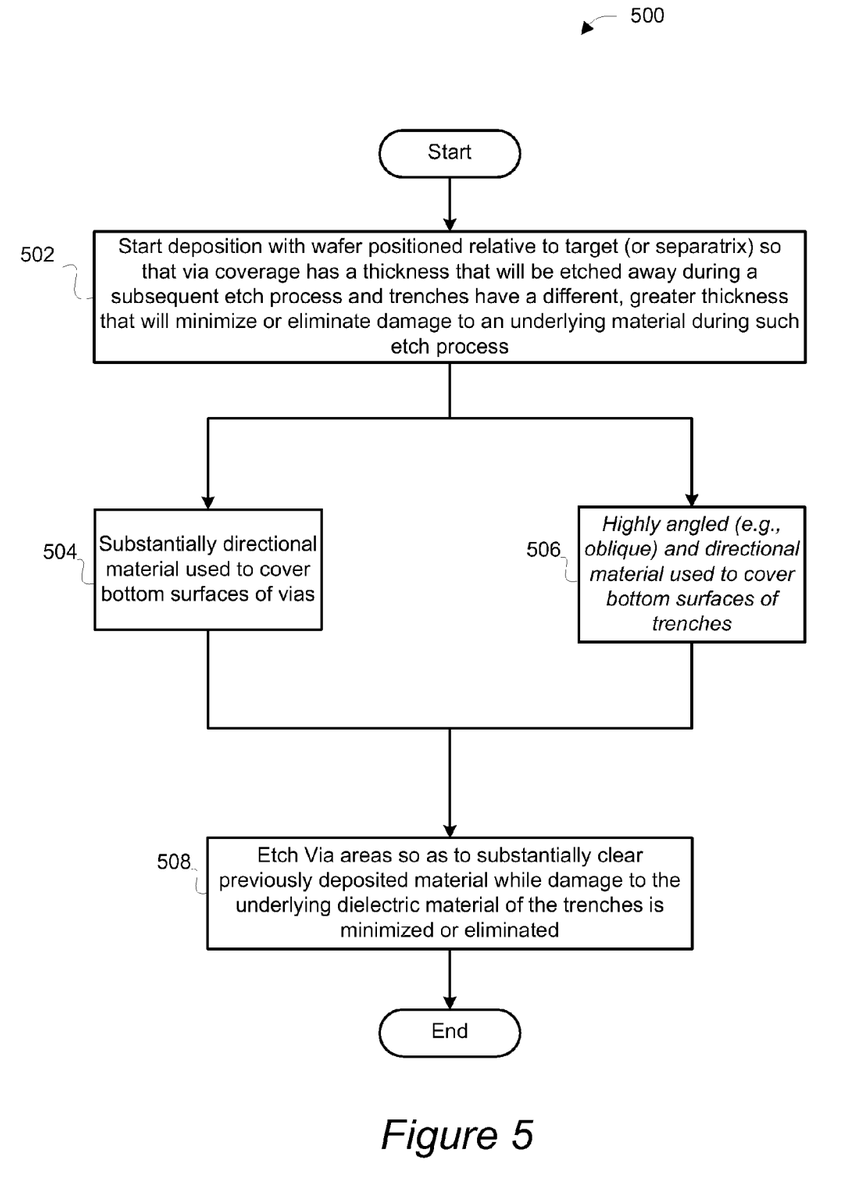
FIG. 5 is a flowchart illustrating a procedure for etching vias without causing significant dielectric damage in accordance with one embodiment of the present invention.

FIG. 5 is a flowchart illustrating a procedure 500 for etching vias without causing significant dielectric damage in accordance with one embodiment of the present invention. This technique may be practiced using any of the deposition systems described herein, e.g., FIGS. 4A–4C. Initially in operation 502, deposition is started with the wafer positioned relative to the target or separatrix so that via coverage has a thickness that will be sufficiently etched away during a subsequent etch step and trenches have a different and greater thickness that will minimize or eliminate damage to the underlying material of the trench during such subsequent etch step. In other words, a first amount of material is deposited in each via to coat the bottom of each via while a second, different amount of material is deposited in each trench to coat the bottom of each trench.

The wafer may be positioned so that SD is greater than 1.2 and most preferably greater than 2.5. As a result of this wafer positioning, substantially directional material is used to cover the bottom surfaces of vias in operation 504 while highly angled (or oblique or non-normal) and directional material are used to cover the bottom surfaces of the trenches in operation 506. The operations for covering the via and trench areas with the deposited material are performed substantially simultaneously in a single deposition process. Said in another way, material for the vias is deposited substantially only in a direction that is normal to the wafer surface and material for the trenches is deposited in a plurality of directions, including a normal direction and one or more non-normal angles. This deposition process may be performed utilizing any of the deposition systems described herein. For example, a three dimensional target may be utilized in the form of an HCM (e.g., FIG. 4A or 4C) or a two-piece target (e.g., FIG. 4B). In some embodiments, material that is sputtered from the sidewalls of the targets is used to cover the trench bottom surfaces in a greater amount than the via bottom surfaces. In a particular embodiment, substantially none of the sidewall material reaches the via bottom surfaces.

After barrier material is deposited, the via areas may be etched to substantially clear the previously deposited material while damage to the dielectric material underlying the trench material is minimized or eliminated in operation 508. In one embodiment, anchors are formed in the dielectric material underlying the barrier material that is etched or resputtered away from the bottom surfaces of the vias while a minimum or zero amount of barrier material remains in the bottom surfaces of the trenches.

Figure 6A:
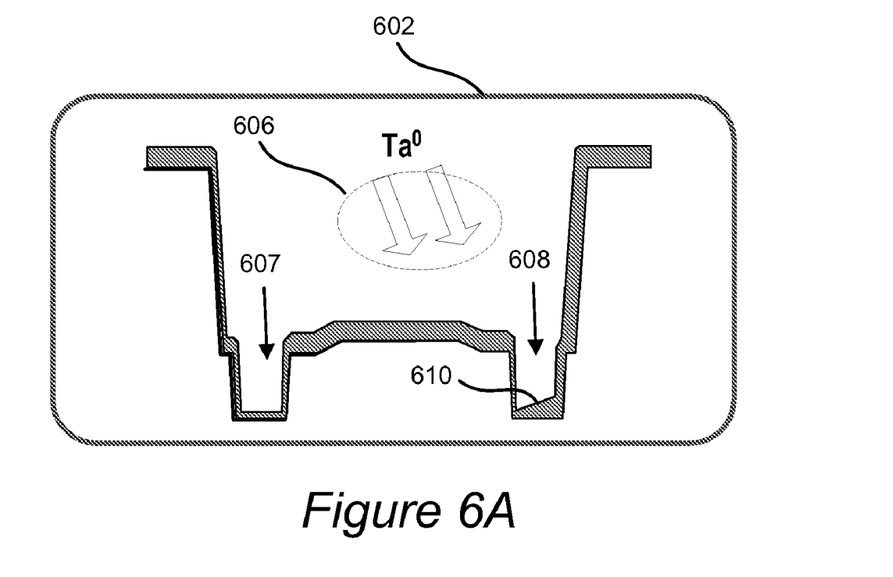
FIG. 6A illustrates a unidirectional, low angle flux effect at the edge of the wafer caused by substantially a long wafer to target throw distance.

Embodiments of the present invention provide several advantages. For example, asymmetric low angle flux is reduced. FIG. 6A illustrates a unidirectional, low angle flux effect at the edge of the wafer caused by substantially a long wafer to target throw distance. The wafer is positioned at a directional distance, e.g., from the target, such that the wafer edge receives material particles that have a symmetric low angle component. However, low angle flux may hit the far edges of the wafer as illustrated in the enlarged area 602 of the right wafer edge. As shown, a via that resides at an outside edge portion of the wafer, such as via 608, may receive a portion of low angle particles 606 to thereby form a asymmetric material deposition 610 in the bottom of such via 608 and not in other vias, such as via 607.

Figure 6B:
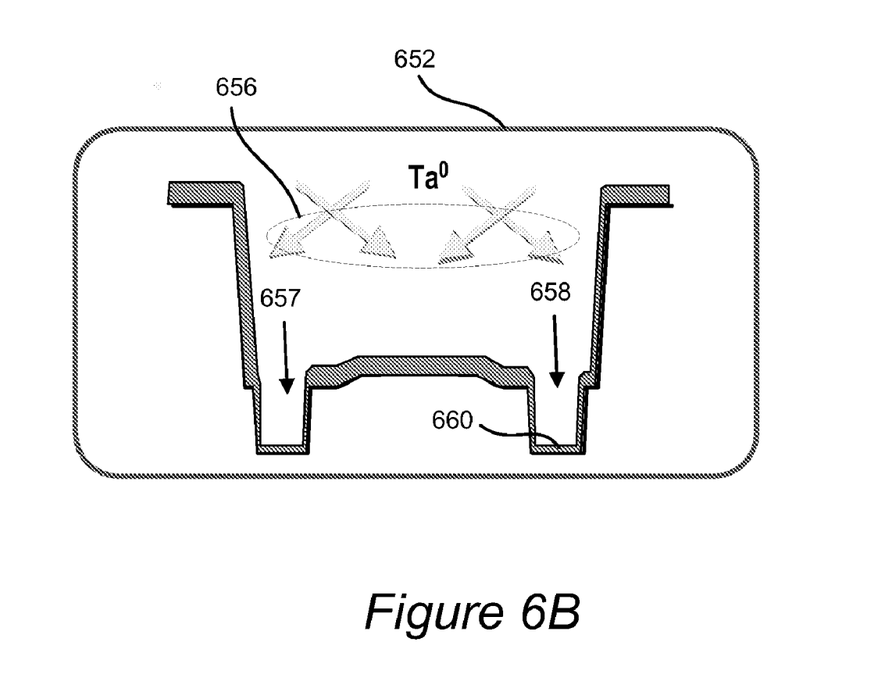
FIG. 6B illustrates minimization or elimination of the asymmetric low angle flux effect by providing selective deposition for vias and trenches in accordance with one embodiment of the present invention.

In contrast, FIG. 6B illustrates minimization or elimination of the asymmetric low angle flux effect by providing selective deposition for vias and trenches in accordance with one embodiment of the present invention. The wafer is positioned at wafer position so as to achieve a non-directional distance, e.g., from the target. As a result, the wafer surface receives a substantially uniform amount of low angled particles in multiple directions across the wafer. As illustrated in an enlargement 652 of the right wafer edge, vias 657 and 658 both receive particles at multiple angles so that material is deposited evenly in all features, via bottom 660.

Figure 7A:
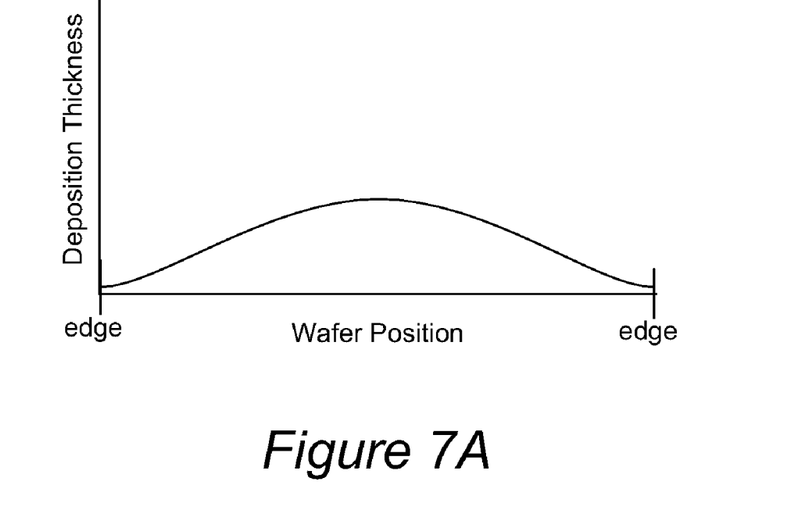
FIG. 7A illustrates an asymmetric deposition effect.
Figure 7B:
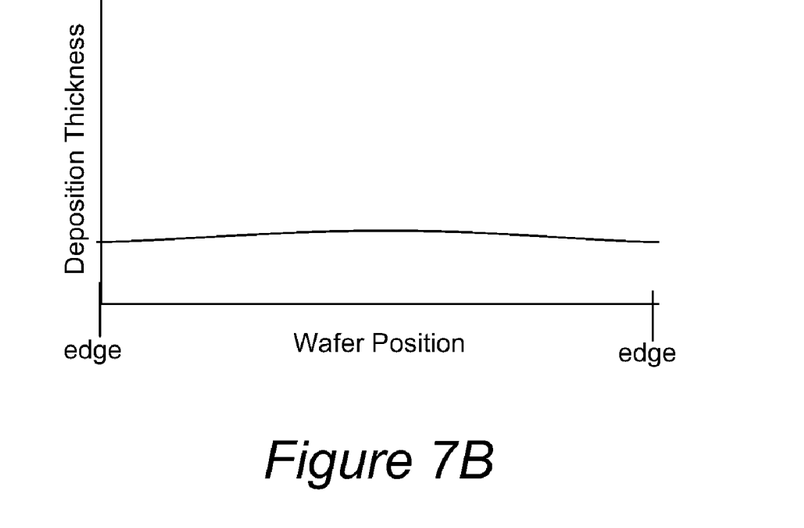
FIG. 7B illustrates minimization of asymmetry by utilization of deposition selectivity for vias and trenches in accordance with one embodiment of the present invention.

Embodiments of the present invention also reduce deposition uniformity. FIG. 7A illustrates a typical deposition thickness profile effect when the wafer is placed at a substantially high directional distance from the target and/or separatrix. In the graph of FIG. 7A, deposition thickness is illustrated as a function of wafer position. As shown, the thickness of the deposition material on the wafer surface is substantially greater in the center of the wafer, as compared to the edges of the wafer. In contrast, FIG. 7B illustrates highly uniform thickness distribution by utilization of deposition selectivity for vias and trenches in accordance with one embodiment of the present invention. As shown, the material that is deposited across the wafer has a substantially same thickness.

Although the foregoing invention has been described in some detail for purposes of clarity of understanding, it will be apparent that certain changes and modifications may be practiced within the scope of the appended claims. Therefore, the described embodiments should be taken as illustrative and not restrictive, and the invention should not be limited to the details given herein but should be defined by the following claims and their full scope of equivalents.

What is claimed is:

1. An apparatus for depositing material on a semiconductor wafer having recessed features, including a plurality of vias and trenches, comprising:

a process chamber having a target for depositing material onto the semiconductor wafer;

a wafer support for holding the wafer in position during deposition of the material; and a controller configured to cause material to be sputtered from the target onto the semiconductor wafer under conditions that coat the recessed features and thereby form the layer of material, wherein the controller is further configured to position the wafer with respect to the target so that a first coverage amount of material deposited in each trench is greater than a second coverage amount of material deposited in each via, wherein the first coverage amount is deposited in each trench substantially simultaneously as the second coverage amount is deposited in each via.

2. An apparatus as recited in claim 1, wherein the target is three dimensional.

3. An apparatus as recited in claim 2, wherein the target is formed from a single piece.

4. An apparatus as recited in claim 3, wherein the target is bell shaped.

5. An apparatus as recited in claim 4, wherein the apparatus is a hollow cathode magnetron (HCM) type.

6. An apparatus as recited in claim 2, wherein the target has a top target surface and a sidewall target surface and wherein the controller is further configured to sputter material from the sidewall target surface and position the wafer with respect to the target so that sputtered sidewall material reaches each trench and not each via.

7. An apparatus as recited in claim 6, wherein the controller is further configured to generate an magnetic field on the sidewall target surface so that a separatrix is formed.

8. An apparatus as recited in claim 7, wherein the separatrix is formed at a bottom edge of the sidewall target surface that is the closest edge to the wafer.

9. An apparatus as recited in claim 7, wherein the separatrix is formed in a top half of the sidewall target surface that is positioned farthest from the wafer and the wafer is positioned adjacent to at least a portion of the target.

10. An apparatus as recited in claim 9, wherein the wafer is positioned between about −1 and +10 centimeters from a bottom edge of the sidewall target surface that is the closest edge to the wafer.

11. An apparatus as recited in claim 2, wherein the target is formed from at least a first target piece and a second target piece, wherein the first piece has a surface that is substantially parallel with the wafer surface on which the recessed features are formed and a second target piece that are substantially perpendicular to the wafer surface on which the recessed features are formed.

12. An apparatus as recited in claim 11, wherein the controller is further configured to generate an magnetic field on the second target piece of the target so that a separatrix is formed.

13. An apparatus as recited in claim 12, wherein the separatrix is formed at a bottom edge of the second target piece of the target that is the closest edge to the wafer and wherein the wafer is positioned greater than 0 and less than about 10 centimeters from the bottom edge of the second target piece.

14. An apparatus as recited in claim 12, wherein the separatrix is formed in a top half of the second target piece of the target that is positioned farthest from the wafer and the wafer is positioned adjacent to at least a portion of the second target piece.

15. An apparatus as recited in claim 13, wherein the separatrix is formed in a top half of the second target piece of the target that is positioned farthest from the wafer and the wafer is positioned between about −1 and +10 centimeters from the bottom edge of the second target piece.

16. The apparatus of claim 1, wherein the controller is further configured to generate a plasma comprising ionized material sputtered from the target.

17. The apparatus of claim 16, wherein the target comprises a metal for forming a diffusion barrier on the semiconductor wafer.

18. The apparatus of claim 17, wherein the diffusion barrier comprises at least one of the following: Ta, $TaN_x$, Ti, $TiN_x$, W, $WN_x$, Ru, or Co.

19. An apparatus as recited in claim 1, wherein a ratio of the second coverage amount over the first coverage amount is greater than about 1.2.

20. An apparatus as recited in claim 1, wherein a ratio of the second coverage amount over the first coverage amount is greater than about 2.5.

21. An apparatus as recited in claim 1, wherein the second coverage amount of material is deposited in a stream of particles that is directed towards the wafer and reaches each trench substantially only in a direction that is substantially normal to a surface of the wafer and the first coverage amount of material is deposited in a plurality of streams of particles that are directed towards the wafer and reaches each via in a plurality of directions in relation to the wafer surface, including a normal direction and a plurality of substantially non-normal angles.

22. An apparatus for depositing material on a semiconductor wafer having recessed features, including a plurality of vias and trenches, comprising:
 a process chamber having a target for sputtering the material onto the semiconductor wafer;
 a wafer support for holding the wafer in position during deposition of the material; and
 a controller that is configured to:
  deposit a first coverage amount of material in each via to coat a bottom of such each via; and
  substantially simultaneously with depositing the first coverage amount of material, deposit a second coverage amount of material in each trench to coat a bottom of such each trench,
  wherein the depositing of the first and second coverage amounts are selectively controlled such that a ratio of the second coverage amount over the first coverage amount is greater than about 1.2.

23. An apparatus as recited in claim 22, wherein the ratio is greater than 2.5.

24. An apparatus as recited in claim 22, wherein the first coverage amount of material is deposited in a stream of particles that is directed towards the wafer and reaches each trench substantially only in a direction that is substantially normal to a surface of the wafer and the second coverage amount of material is deposited in a plurality of streams of particles that are directed towards the wafer and reaches each via in a plurality of directions in relation to the wafer surface, including a normal direction and a substantially non-normal angle.

25. An apparatus as recited in claim 22, the controller further configured to resputter substantially all of the first coverage amount of material from each via without damaging a dielectric material that lies beneath each trench.

* * * * *